(12) United States Patent
Sugahara

(10) Patent No.: US 7,839,057 B2
(45) Date of Patent: Nov. 23, 2010

(54) MOVEMENT DETECTOR

(75) Inventor: Hiroto Sugahara, Aichi-ken (JP)

(73) Assignee: Brother Kogyo Kabushiki kaisha, Aichi-Ken (JP)

( * ) Notice: Subject to any disclaimer, the term of this patent is extended or adjusted under 35 U.S.C. 154(b) by 37 days.

(21) Appl. No.: 12/221,263

(22) Filed: Aug. 1, 2008

(65) Prior Publication Data
US 2009/0033178 A1 Feb. 5, 2009

(30) Foreign Application Priority Data
Aug. 2, 2007 (JP) ............................. 2007-201992

(51) Int. Cl.
*H01L 41/113* (2006.01)
(52) U.S. Cl. .................. 310/338; 310/317; 310/329; 310/330; 310/331; 310/332
(58) Field of Classification Search ............ 310/316.01, 310/317, 329–332, 338
See application file for complete search history.

(56) References Cited

U.S. PATENT DOCUMENTS

| | | | | |
|---|---|---|---|---|
| 5,138,216 A | * | 8/1992 | Woodruff et al. | ...... 310/316.01 |
| 5,767,405 A | * | 6/1998 | Bernstein et al. | ......... 73/504.16 |
| 5,833,713 A | * | 11/1998 | Moberg | ........................ 607/19 |
| 5,912,524 A | * | 6/1999 | Ohnishi et al. | ............... 310/321 |
| 6,624,549 B2 | * | 9/2003 | Takeuchi et al. | ............ 310/330 |
| 7,550,901 B2 | * | 6/2009 | Chrysler et al. | ............. 310/330 |
| 2001/0011479 A1 | * | 8/2001 | Takeuchi et al. | ......... 73/504.12 |

FOREIGN PATENT DOCUMENTS

| | | | |
|---|---|---|---|
| FR | 2557695 | * | 7/1985 |
| JP | 63-149502 | * | 6/1988 |
| JP | 4-20864 | * | 1/1992 |
| JP | 11-142197 | * | 5/1999 |
| JP | 2002157063 | | 5/2002 |
| WO | WO 00/49368 | * | 8/2000 |

* cited by examiner

*Primary Examiner*—Thomas M Dougherty
(74) *Attorney, Agent, or Firm*—Frommer Lawrence & Haug LLP

(57) ABSTRACT

A movement detector which is rotatably installed on a base member includes a rotating member which has a body portion, and a connecting portion which rotatably connects the body portion to the base member, a piezoelectric layer which is formed on the connecting portion, and a plurality of electrodes which are provided on the piezoelectric layer, to be arranged in a direction of a rotation axis of the body portion, and which detect a voltage generated in the piezoelectric layer corresponding to a deformation of the connecting portion when the body portion has displaced with respect to the base member. Since the piezoelectric layer and the plurality of electrodes are provided to the connecting portion which rotatably connects the body portion to the base member, it is possible to detect a plurality of types of movements of the body portion by the piezoelectric layer and the plurality of electrodes.

12 Claims, 14 Drawing Sheets

Fig. 5

| PROCESS ITEM | OPERATION BY USER (STATE OF OPERATION TAB) | PIEZOELECTRIC ELEMENT | | DISPLAY |
|---|---|---|---|---|
| | | PIEZOELECTRIC LAYER DEFORMATION | VOLTAGE GENERATED | |
| A | STANDBY POSITION | NIL | 0 | IMAGE FOLDER NAME DISPLAYED |
| B | TURN TO RIGHT (AT LOW SPEED) | COMPRESSION (SMALL) | − (LOW) | CHANGED TO SUBSEQUENT IMAGE |
| C | TURN TO LEFT (AT LOW SPEED) | EXTENSION (SMALL) | + (LOW) | CHANGED TO PREVIOUS IMAGE |
| D | TURN TO RIGHT (AT HIGH SPEED) | COMPRESSION (SUBSTANTIAL) | − (HIGH) | DOES NOT CHANGE |
| E | TURN TO LEFT (AT HIGH SPEED) | EXTENSION (SUBSTANTIAL) | + (HIGH) | DOES NOT CHANGE |

Fig. 6

| PROCESS ITEM | OPERATION BY USER | FIRST PIEZOELECTRIC ELEMENT | | SECOND PIEZOELECTRIC ELEMENT | | PROCESS CONTENT |
|---|---|---|---|---|---|---|
| | | PIEZO-ELECTRIC LAYER DEFORMATION | VOLTAGE GENERATED | PIEZOELECTRIC LAYER DEFORMATION | VOLTAGE GENERATED | |
| A | PULL DOWNWARD | EXTENSION | + | COMPRESSION | − | START RECORDING OF DISPLAY IMAGE |
| B | PULL UPWARD | COMPRESSION | − | EXTENSION | + | CANCEL RECORDING OF DISPLAY IMAGE |

Fig. 7

| PROCESS ITEM | OPERATION BY USER | DISPLAY |
|---|---|---|
| A | STANDBY POSITION | IMAGE FOLDER NAME DISPLAYED |
| B | TURN TO RIGHT (AT LOW SPEED) → TURN TO LEFT (AT HIGH SPEED) | CHANGED TO SUBSEQUENT IMAGE |
| C | TURN TO LEFT (AT LOW SPEED) → TURN TO RIGHT (AT HIGH SPEED) | CHANGED TO PREVIOUS STATE |

MOVEMENT DETECTOR

CROSS REFERENCE TO RELATED APPLICATION

The present application claims priority from Japanese Patent Application No. 2007-201992, filed on Aug. 2, 2007, the disclosure of which is incorporated herein by reference in its entirety.

BACKGROUND OF THE INVENTION

1. Field of the Invention

The present invention relates to a movement detector which includes a rotating member which is rotatably connected to a base member, and a piezoelectric element for detecting various movements of the rotating member.

2. Description of the Related Art

An apparatus which detects a movement of an operating section etc. of an electronic equipment by using a piezoelectric element which converts a distortion, developed in a piezoelectric material layer when an external force is acted thereon, to an electric signal, has hitherto been known.

For example, in Japanese Patent Application Laid-open No. 2002-157063, a movement detecting apparatus which detects a movement of an operating lever which is used in a state of being connected to a PC (personal computer) etc. has been described. A lower surface of the operating lever is joined to a ceramics plate, and furthermore, a plurality of stress sensors is provided between a base portion and the ceramics plate. When the operating lever is moved in a horizontal direction (x, y direction), or in a direction of approaching to the base portion (+z direction: direction of pushing), an external force acting on each of the sensors is converted to an electric signal, and based on these signals, a movement of the operating lever in the horizontal direction and the pushing direction is detected. Moreover, there has been a mention that, it is possible to use a piezoelectric element as the sensors which detect the movement of the operating lever.

However, the movement detecting apparatus described in Japanese Patent Application Laid-open No. 2002-157063 is not capable of detecting all movements of the operating lever by a user. In other words, this movement detecting apparatus detects only a movement of the operating lever in the horizontal direction (x, y direction) and the pushing direction (+z direction), and is not structured to be capable of detecting a movement of the operating lever in a pulling direction (-z direction).

Furthermore, when a shape of an object of which the movement is to be detected, and a purpose of operation are different, the structure described in Japanese Patent Application Laid-open No. 2002-157063 is not applicable as it is. Particularly, when an object of which the movement is to be detected is a rotating member which is rotatably connected to a base member, and in a case of detecting a rotating movement, a movement of coming closer to/going away from the base member, or a twisting movement of the rotating operation, it is not possible to use a structure for detecting the movement of the operating lever described in Japanese Patent Application Laid-open No. 2002-157063, and it is necessary to use an appropriate structure in accordance with the movement of the rotating member.

SUMMARY OF THE INVENTION

An object of the present invention is to provide a movement detector which is detects various movements of a rotating member which is rotatably connected to a base member, by using a piezoelectric element.

According to a first aspect of the present invention, there is provided a movement detector which is rotatably attached to a base member, including: a rotating member which has a body portion, and a connecting portion which rotatably connects the body portion to the base member; a piezoelectric layer which is formed on the connecting portion; and a plurality of electrodes which are provided on the piezoelectric layer and arranged in a direction of a rotation axis of the body portion, and which detect a voltage generated in the piezoelectric layer corresponding to a deformation of the connecting portion when the body portion is displaced with respect to the base member.

According to this structure, since the piezoelectric layer and the plurality of electrodes are provided to the connecting portion which rotatably connects the body portion to the base member, it is possible to detect a plurality of types of movements of the body portion by the piezoelectric layer and the plurality of electrodes.

In the movement detector of the present invention, the piezoelectric layer may be formed as a plurality of piezoelectric layers which are arranged in the direction of the rotation axis of the body portion, and each of the plurality of electrodes may be formed on one of the piezoelectric layers.

The movement detector of the present invention may further include a detector which detects a movement of the body portion based on a voltage detected by the electrodes. When the movements of the body portion differ, a deformation peculiar to each movement is developed-in the connecting portion. As the connecting portion is deformed, voltage signals output from a plurality of piezoelectric elements differ according to the deformation of the connecting portion. Consequently, the detector can detect upon distinguishing the plurality of movements of the body portion based on the voltage signals output from the plurality of the piezoelectric elements respectively.

In the movement detector of the present invention, the connecting portion may have a plurality of element installing portions on which, the plurality of piezoelectric layers are formed respectively, and the element installing portions may be arranged to be mutually separated in the direction of the rotation axis of the body portion. In this case, since the plurality of element installing portions are mutually separated, an amount of deformation of each piezoelectric installing portion becomes substantial, and it is possible to detect more accurately the movement of the body portion by the plurality of piezoelectric layers and electrodes.

In the movement detector of the present invention, the element installing portion may be formed of a metallic material, and a predetermined electric potential may be always applied to the element installing portion. In this case, the element installing portion also serves as a reference electrode which keeps a lower surface of the piezoelectric layer at a reference electric potential all the time.

In the movement detector of the present invention, a thickness of the connecting portion may be less than a thickness of the body portion. In this case, it is possible to increase the amount of deformation of the connecting portion when the body portion moves, and to detect accurately the movement of the body portion by the plurality of piezoelectric layers and electrodes.

In the movement detector of the present invention, the connecting portion may be formed of a metallic material. Since the connecting portion is formed of a metallic material, a fatigue strength of the connecting portion with respect to a repeated bending becomes high, and a durability of the connecting portion is improved. Moreover, the connecting portion being electroconductive, it is possible to use the connecting portion as a reference electrode with respect to the piezoelectric layer and the electrode.

In the movement detector of the present invention, the detector may detect a direction of rotation of the body portion based on a polarity of a voltage signal detected by the electrode. In this case, it is possible to detect easily a direction of rotation of the body portion (direction around the rotating axis mainly) only by identifying the polarity of the voltage signal.

In the movement detector of the present invention, the detector may detect a movement speed of the body portion based on a magnitude of a voltage signal detected by the electrodes. In this case, it is possible to detect easily the movement speed of the body portion only by identifying the magnitude of the voltage signal.

In the movement detector of the present invention, the detector may detect a component of movement in a direction, which is different from a direction orthogonal to the direction of the rotation axis of the body portion, based on a difference in voltage signals detected by the electrodes. In this case, it is possible to detect easily a component of movement in the direction difference from the direction orthogonal to the direction of the rotation axis only by identifying the difference in the plurality of voltage signals.

The movement detector of the present invention may further include a voltage applying section which applies an alternating voltage to at least one of the plurality of electrodes to vibrate the body portion. In this case, since it is possible to transmit information such as a warning to an operator of the body portion, it is possible to make it further convenient to use.

In the movement detector of the present invention, the movement detector may be provided on a printer having an image display section which displays images of image data, an image recording section which records, on a recording medium, an image of an image datum among the image data selected, and a controller which controls the image display section and the image recording section; and the body portion may be rotatably connected to an attachment surface provided on a printer body, via the connecting portion, and the piezoelectric layers and the electrodes formed on the connecting portion may output, to the controller, a signal for changing the image data to be displayed on the image display section, or may output a signal for selecting the image data which is displayed on the image display section, according to a deformation of the connecting portion when the body portion is operated. The present invention is an example in which, the movement detector according to the first aspect described above is applied to a structure for changing the image data to be displayed on the image display section, or selecting the image data which is displayed on the image display section in the printer which records an image. The body portion of the rotating member is rotatably connected to the attachment surface of the printer body via the connecting portion. When various movements (such as rotating movement) of the body portion are carried out, a deformation peculiar to each movement is developed in the connecting portion. Moreover, the plurality of piezoelectric layers and electrodes provided on the connecting portion output to the controller, a signal for changing the image data to be displayed on the image display section, or a signal for selecting the image data which is displayed on the image display section, according to a deformation of the connecting portion which has occurred due to the operation of the body portion by the user.

In the movement detector of the present invention, the movement detector may be provided on a channel forming member having a channel through which a fluid flows, and the body portion may be arranged inside the channel to make contact with the fluid, and may be rotatably connected to a surface inside the channel via the connecting portion. The present invention is an example, in which the movement detector according to the first aspect described above is applied to a structure for detecting a fluid state of a fluid which flows through the channel formed in the channel forming member. The body portion of the rotating member is rotatably connected to the inner surface of the channel formed in the channel forming member, via the connecting portion. When the fluid flowing through the channel collides with the body portion, various movements of the body portion occur according to a manner of the collision, and a deformation peculiar to each movement is developed in the connecting portion. According to the deformation of the connecting portion developed in such manner, a voltage is developed in the plurality of piezoelectric layers provided to the connecting portion. By detecting the voltage developed via the plurality of electrodes, it is possible to detect a behavior (fluid state) of the fluid.

BRIEF DESCRIPTION OF THE DRAWINGS

FIG. 5 is a diagram showing a display-image changing process;

FIG. 6 is a diagram showing an image selecting process;

FIG. 7 is a diagram showing a display-image changing process according to a modified embodiment;

DETAILED DESCRIPTION OF THE PREFERRED EMBODIMENTS

Figure 1:
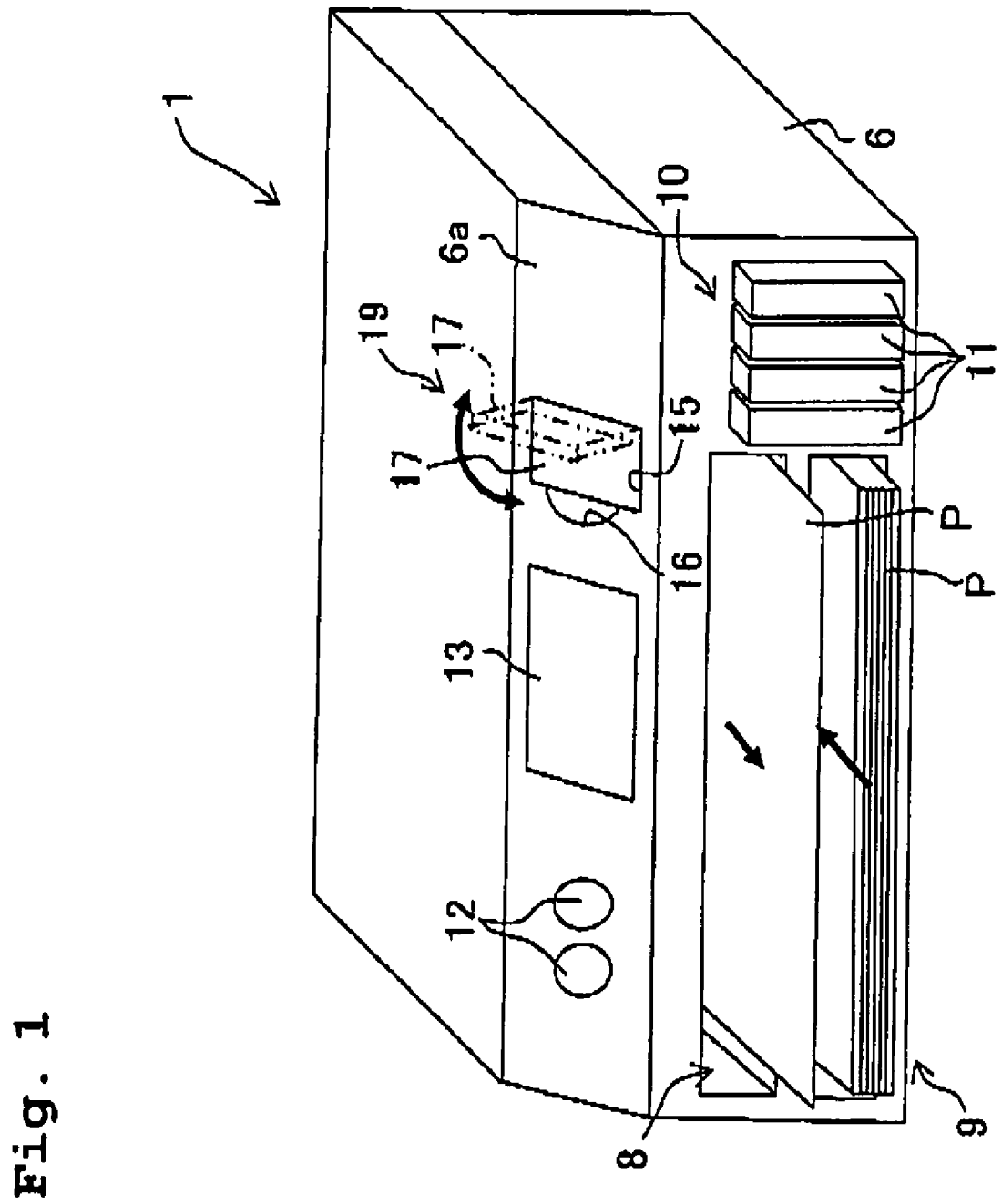
FIG. 1 is an external perspective view of a printer according to a first embodiment of the present invention.

A first embodiment of the present invention will be described below. The first embodiment is an example in which a movement detector of the present invention is applied to a structure, in a printer for recording an image on a printing paper, to change image data displayed on a display or to select image data displayed on the display. FIG. 1 is a perspective view of the printer according to the first embodiment and FIG. 2 is a block diagram which schematically shows an electrical arrangement of the printer.

Figure 2:
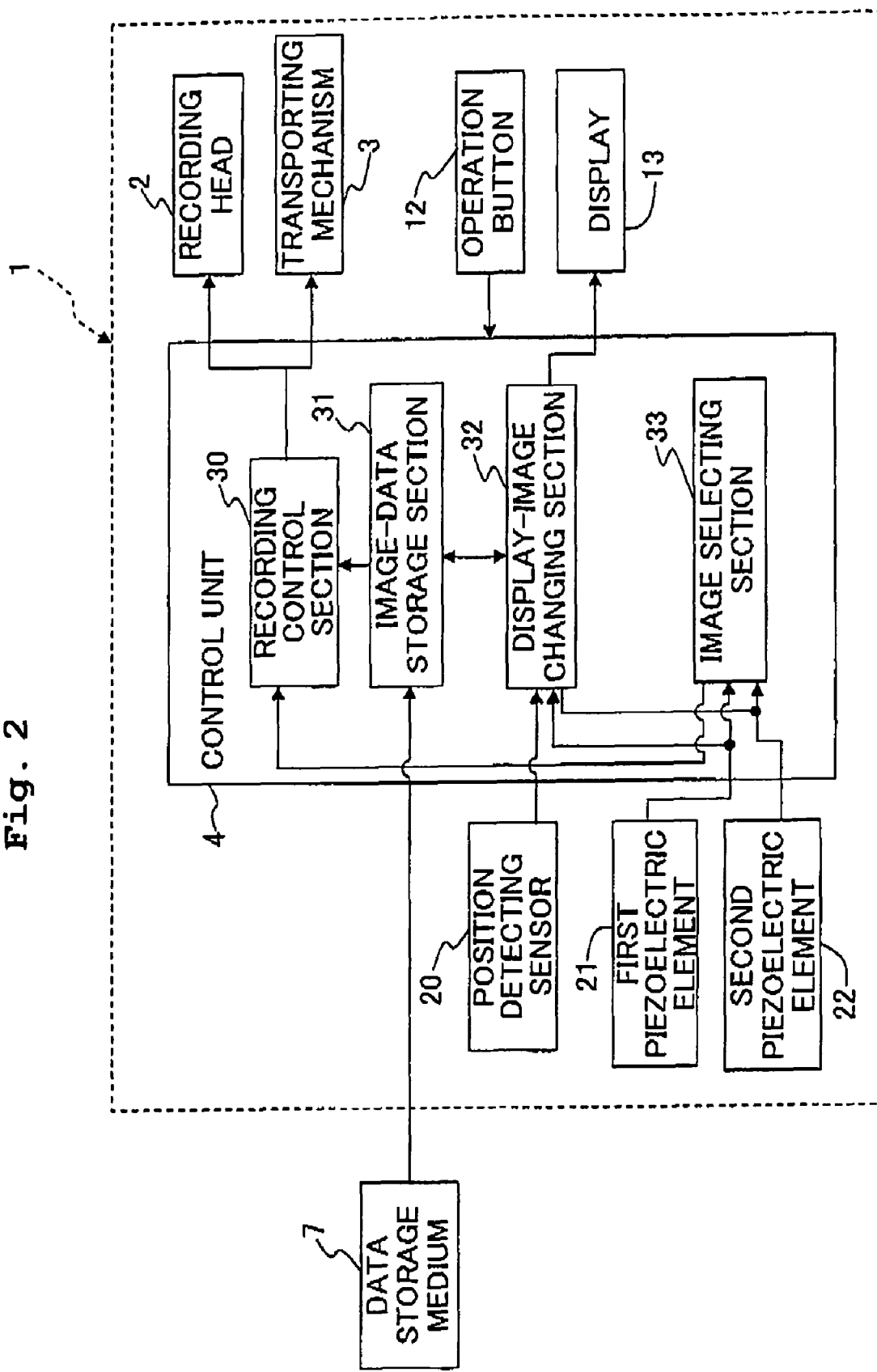
FIG. 2 is a block diagram showing schematically an electrical arrangement of the printer according to the first embodiment.

As shown in FIG. 1 and FIG. 2, a printer 1 of the first embodiment includes a recording head 2 (image recording section) which records an image on a printing paper P (recording medium), a transporting mechanism 3 which transports the printing paper P in a predetermined direction (frontward direction in FIG. 1), and a control unit 4 (a controller) which controls each of various mechanisms of the printer 1 including the recording head 2 and the transporting mechanism 3.

As shown in FIG. 1, the printer 1 has a printer body 6 having a substantially box shape, and components such as the recording head 2 and the transporting mechanism 3 are accommodated inside the printer body 6. As the recording head 2, a head which carries out printing on the recording paper P by a known method such as an ink-jet method, a laser method, or a thermal transfer method is used. The recording head 2 records on the printing paper P an image of image data (image file) which is input from a data recording medium 7 (refer to FIG. 2), based on a command from the control unit 4, with the data recording medium 7 in which the image data is recorded connected to the printer 1. In the following description, one image data means a set of integrated data which forms one image.

A part of a lower half portion of the printer main body 6 is open frontward, and a paper feeding tray 9 in which the printing papers P are accommodated, and a paper discharge tray 8 in which the printing paper P with an image recorded thereon is discharged are provided in the open portion of the printer main body 6. The transporting mechanism 3 transports the recording paper P inside the paper feeding tray 9 to the recording head 2 inside the printer body 6 and discharges the printing paper P with an image recorded thereon by the recording head 2 to the paper discharge tray 8 at the front side, by transporting rollers which are driven to be rotated by a motor.

A cartridge mounting portion 10 is provided at a side position of the paper feeding tray 9 and the paper discharge tray 8, and four ink cartridges 11 containing inks of four colors (yellow, magenta, cyan, and black) respectively are detachably mounted on the cartridge mounting portion 10.

On an upper half portion of the printer body 6 (base member), an attachment surface 6a which is inclined frontward is formed to face a user positioned at a front side of the paper surface of FIG. 1. A plurality of operation buttons 12 which are to be operated by the user, and a display 13 (image display portion) which displays information such as an operating condition of the printer 1 and an error message, and an image of the image data are provided on the attachment surface 6a.

Moreover, as shown in FIG. 1, a recess 15 having a rectangular shape in a plan view is formed in the attachment surface 6a, at a position on a right side of the display 13. Furthermore, the attachment surface 6a is provided with a rotating member 19 which has an operation tab 17 (body portion) having a rectangular shape and which is slightly smaller than the recess 15, and which is accommodated in the recess 15, and a connecting portion 18 which connects the operation tab 17 to the attachment surface 6a (refer to FIG. 3). The operation tab 17 is rotatably attached to the attachment surface 6a via the connecting portion 18, with a virtual rotation axis C as a center.

Figure 3:
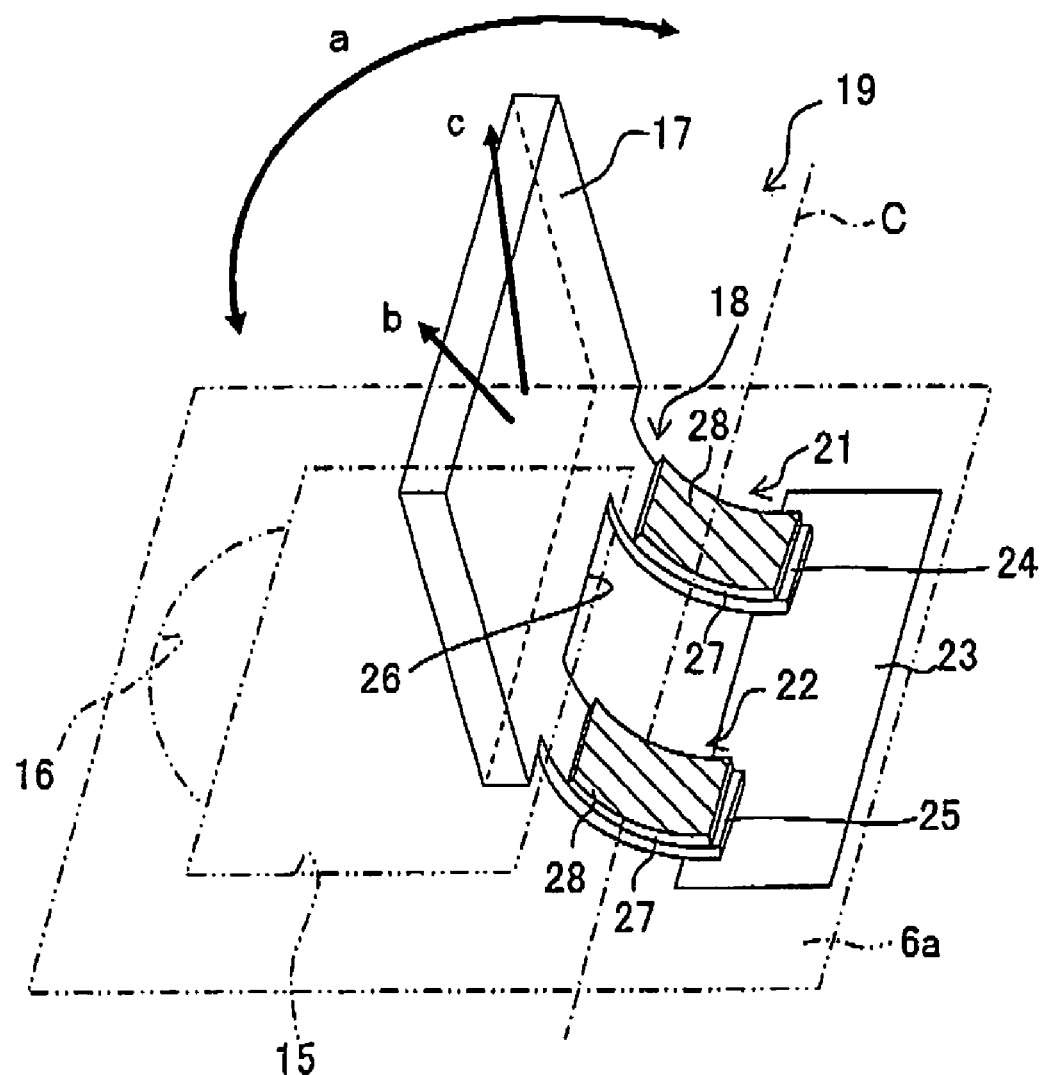
FIG. 3 is a perspective view of a rotating member of the first embodiment.
Figure 4:
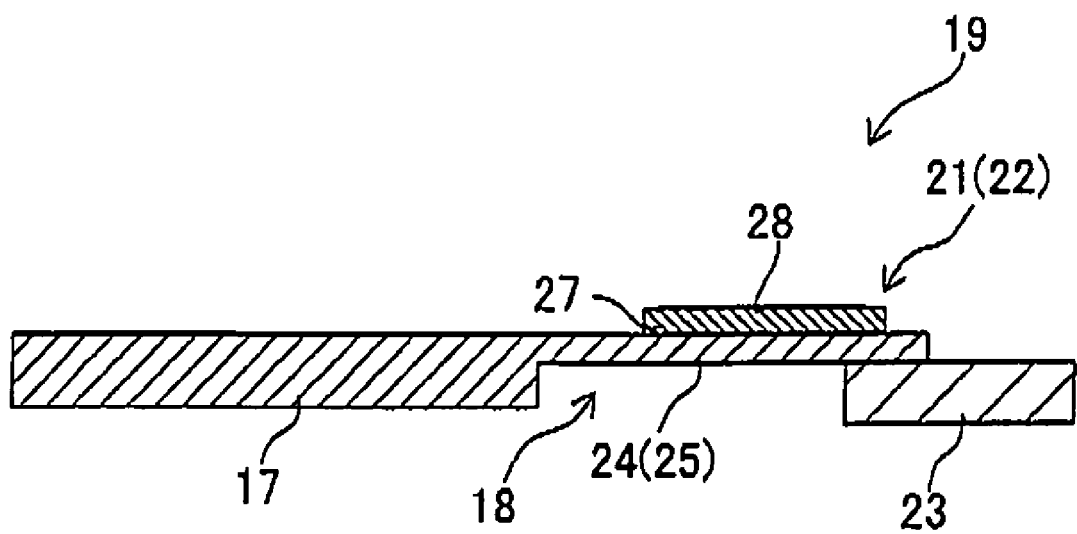
FIG. 4 is a cross-sectional view of a rotating member in FIG. 3.

FIG. 3 is a perspective view of the rotating member 19, and FIG. 4 is a cross-sectional view of the rotating member 19. As shown in FIG. 3, an installing portion 23 made of a metallic material on which the rotating member 19 is attached is fixed to the attachment surface 6a. Moreover, the connecting portion 18 made of two element arranging portions (first element arranging portion 24 and second element arranging portion 25) arranged to be lined along a longitudinal direction of the operation tab 17 (in the direction of the rotation axis) is provided at one end portion in a direction of a short side of the rectangular shaped operation tab 17. A notch 26 is formed between the first element arranging portion 24 and the second element arranging portion 25, and the first element arranging portion 24 and the second element arranging portion 25 are arranged being separated mutually in the longitudinal direction of the operation tab 17. The operation tab 17, and the first element arranging portion 24 and the second element arranging portion 25 are formed integrally of a metallic material such as stainless steel. End portions of the first element arranging portion 24 and the second element arranging portion 25, on a side opposite to the operation tab 17 are connected and fixed to the installing portion 23 which is fixed to the attachment surface 6a, and the operation tab 17 is connected to the installing portion 23 on the attachment surface 6a via the connecting portion 18 formed of the first element arranging portion 24 and the second element arranging portion 25.

The operation tab 17 is accommodated in the recess 15, and may be in a standby position (a state shown by solid lines in FIG. 1) of being mounted on the attachment surface 6a (a bottom surface of the recess 15), and a state of being rotated from the standby position with the rotation axis C as a center (a state shown by alternate long and short dash lines in FIG. 1, a state in FIG. 3). When the operation tab 17 is in the standby position, an upper surface of the operation tab 17 accommodated in the recess 15 and an upper surface of the attachment surface 6a around the recess 15 are almost in the same plane. A recess 16 for making it easy for the user to pull out the operation tab 17 accommodated in the recess 15 is provided at a left edge portion of the recess 15. The display 13 is on the substantially same plane as the operation tab 17 in the state of being mounted on the attachment surface 6a, and is arranged on a side (left side) opposite to the rotation axis C, with respect to the operation tab 17 in the standby position. In other words, the display 13 is positioned on a reverse side of a side in which the operation tab 17 rotates from the standby position with respect to the operation tab 17.

As shown in FIG. 4, a thickness of each of the first element arranging portion 24 and the second element arranging portion 25 forming the connecting portion 18 is smaller than a thickness of the operation tab 17. Moreover, as shown in FIG. 3, the structure is such that by deformation due to bending of the first element arranging portion 24 and the second element arranging portion 25 having the smaller thickness, the operation tab 17 rotates around the rotation axis C parallel to the attachment surface 6a. Moreover, a position detecting sensor 20 which detects as to whether or not the operation tab 17 is at the standby position is provided on the attachment surface 6a (refer to FIG. 2). As the position detecting sensor, it is possible to use a contact sensor 20, which detects the operation tab 17 by making a contact with the operation tab 17 when mounted on the attachment surface 6a. It is also possible to use an optical sensor which includes a light emitting element and a light receiving element.

A piezoelectric layer 27 and a detecting electrode 28 are formed on each of an upper surface (outer surface) of the first element arranging portion 24 and the second element arranging portion 25. In the following description, the piezoelectric layer 27 and the detecting electrode 28 formed on the first element arranging portion 24 is called as a first piezoelectric element 21, and the piezoelectric element 27 and the detecting electrode 28 formed on the second element arranging portion 25 is called as a second piezoelectric element 22.

The piezoelectric layer 27 is made of a piezoelectric material which is principally composed of lead zirconium titanate (PZT) which is a solid solution of lead titanate and lead zirconate, and which is a ferroelectric substance, and is formed to be rectangular shaped in a plan view. The piezoelectric layer 27 is formed by a method such as an aerosol deposition method. Moreover, the piezoelectric layer 27 is polarized in a direction of thickness. The detecting electrode 28 is formed of an electroconductive material such as gold, copper, silver, palladium, platinum, or titanium.

As it has been described above, the first element arranging portion 24 and the second element arranging portion 25 on which the piezoelectric layer 27 is arranged are made of a metallic material which is electroconductive, and a predetermined reference electric potential is always applied to the first element arranging portion 24 and the second element arranging portion 25 via the installing portion 23 which is also electroconductive. In other words, each of the first element arranging portion 24 and the second element arranging portion 25 made of a metallic material faces to the detecting electrode 28, sandwiching the piezoelectric layer 27 therebetween, and also function as a reference electrode which maintains a lower surface of the piezoelectric layer 27 at the reference electric potential all the time.

When the operation tab 17 is operated by the user, the first element arranging portion 24 and the second element arranging portion 25 are bent and deformed due to a displacement of the operation tab 17 with respect to the attachment surface 6a. Furthermore, with the deformation by bending of the first element arranging portion 24 and the second element arranging portion 25, a distortion is generated in the piezoelectric layer 27 of the first piezoelectric element 21 and the second piezoelectric element 22. Due to the distortion of the piezoelectric layer 27, a voltage is generated in the piezoelectric layer 27, and the voltage generated is detected by the electrode 28 and the first element arranging portions 24 and the second element arranging portion 25 as the reference electrode. In other words, the voltage corresponding to the deformation of the first element arranging portion 24 and the second element arranging portion 25 is generated in the first piezoelectric element 21 and the second piezoelectric element 22. Moreover, when the piezoelectric layer 27 is compressed in a planar direction, a negative voltage is generated in the first piezoelectric element 21 and the second piezoelectric element 22, and when the piezoelectric layer 27 is extended in the planar direction, a positive voltage is generated in the first piezoelectric element 21 and the second piezoelectric element 22.

The 'negative voltage' indicates a state in which an electric potential of the detecting electrode 28 is lower than an electric potential (reference electric potential) of the first element arranging portion 24 and the second element arranging portion 25 as the reference electrodes, and the 'positive voltage' indicates a state in which the electric potential of the detecting electrode 28 is higher than the electric potential of the first element arranging portion 24 and the second element arranging portion 25. Moreover, higher a speed of deformation by bending of the first element arranging portion 24 and the second element arranging portion 25, and shorter the time taken for the compression and the extension of the piezoelectric layer 27 of the first piezoelectric element 21 and the second piezoelectric element 22, a value of the voltage (absolute value) generated in the first piezoelectric element 21 and the second piezoelectric element 22 becomes greater. Based on a voltage signal (in other words, whether the voltage is positive or negative and the voltage value) which is output from the first piezoelectric element 21 and the second piezoelectric element 22, the control unit 4 is capable of identifying the movement of the operation tab 17.

More concretely, when the operation tab 17 in the form of a plate is held and rotated in the manner of turning a page of a book by the user, a voltage signal corresponding to the rotating operation is output from the first piezoelectric element 21 and the second piezoelectric element 22 to the control unit 4, and an image displayed on the display 13 is changed (display-image changing process). Furthermore, when the operation tab 17 in the form of a plate is pulled by the user to be separated away from the attachment surface 6a, a voltage signal corresponding to the movement is output from the first piezoelectric element 21 and the second piezoelectric element 22, to the control unit 4. As the voltage signal is output, image data displayed on the display 13 is selected, and various processes such as a recording on the printing paper P are carried out for the selected image data based on the voltage signal (image selecting process). The display-image changing process and the image selecting process which are carried out when the operation tab 17 is operated will be described in further detail in the description of the control unit 4.

Next, an electrical structure of the printer 1 by referring mainly to the control unit 4 will be described in detail by referring to a block diagram in FIG. 2. The control unit 4 includes a CPU (Central Processing Unit), a ROM (Read Only Memory) in which computer programs and data etc. for controlling various mechanisms in the printer 1 are stored, a RAM (Random Access Memory) which stores temporarily data which is to be processed by the CPU, and an input-output interface which inputs and outputs signals between the printer 1 and an external apparatus.

As shown in FIG. 2, the control unit 4 has a recording control section 30 and an image-data storage section 31 in which image data input from the data recording medium 7 is stored. A plurality of image data which is ordered in advance based on certain predetermined conditions, such as names of data files (in alphabetical order for example), and date and time of creating the image data is recorded upon being divided in image folders, in the data recording medium 7. With the data recording medium 7 connected to the printer 1, the plurality of image data read from the data recording medium 7 is stored in the image-data storage section 31.

Examples of the data recording medium 7 in which the image data is stored are storage devices which are connected by being inserted into a slot etc. of a printer, such as a USB memory and a memory card, or external storage devices which are connected with a wire such as a cable, or which are connected without a wire.

The recording control section 30 controls the recording head 2 and the transporting mechanism 3 by referring to the data stored in the image-data storage section 31 to print an image of image data selected by the user on the printing paper P. Moreover, the control unit 4 controls the display 13 to display a state of the printer 1 (image recording state or standby state) and an error etc. on the display 13, and informs (notifies) this information to the user.

Furthermore, the control unit 4 is provided with a function of changing the image data to be displayed on the display according to the ordering of the plurality of data based on the operation of the operation tab 17 by the user, and a function of selecting the image data which is displayed as image on the display 13 according to the operation of the operation tab 17 by the user.

In other words, the control unit 4 includes a display-image changing section 32 which is connected to the first piezoelectric element 21 and the second piezoelectric element 22 by wires which are not shown in the diagram, and which detects a rotational movement of the operation tab 17 based on the voltage signal output from each of the first piezoelectric element 21 and the second piezoelectric element 22, and changes image data to be displayed as an image on the display 13. Moreover, the control unit includes the image selecting section 33 which is connected to the first piezoelectric element 21 and the second piezoelectric element 22 by wires which are not shown in the diagram, and which detects the movement of the operation tab 17 when pulled from the attachment surface 6a based on the voltage signal output from each of the first piezoelectric element 21 and the second piezoelectric element 22, and selects image data of which an image is displayed on the display 13.

The recording control section 30, the image-data storage section 31, the display-image changing section 32, and the image selecting section 33 are realized by the CPU, the ROM, and the RAM etc. which form the control unit 4. In other words, various computer programs such as a computer program for changing the display image on the display 13, and a computer program for selecting the image which is displayed on the display 13 are stored in the control unit 4, and by executing the computer programs stored in the ROM by the control unit 4, the function of each of the recording control section 30, the image-data storage section 31, the display-image changing section 32, and the image selecting section 33 is realized.

Moreover, the display-image changing section 32 and the image selecting section 33 which detect the movement of the operation tab 17 based on the output signal (voltage signal) from the first piezoelectric element 21 and the second piezoelectric element 22 correspond to a detector of the present invention. Furthermore, the rotating member 19 which has the operation tab 17 and the connecting portion 18, the first piezoelectric element 21 and the second piezoelectric element 22 provided to the connecting portion 18, and the display-image changing section 32 and the image selecting section 33 correspond to movement detector of the present invention.

A display-image changing process by the display-image changing section 32 will be described below by referring to process diagrams in FIG. 3 and FIG. 5. As shown by an arrow a in FIG. 3, when the operation tab 17 is turned by the user to left and right around the rotation axis C, the first piezoelectric element 21 and the second piezoelectric element 22 output a signal for changing the image data displayed on the display 13, to the display-image changing section 32.

When the operation tab 17 is detected to be at a standby position of being mounted on the attachment surface 6a (standby position) by the position detecting sensor 20, with the data recording medium 7 in a state of being connected to the control unit 4 of the printer 1, the first element arranging portion 24 and the second element arranging portion 25 are not bent and deformed. Consequently, there is no distortion (deformation) generated in the piezoelectric layer 27 of the first piezoelectric element 21 and the second piezoelectric element 22, and no voltage is generated in the first piezoelectric element 21 and the second piezoelectric element 22 (process item A in FIG. 5). In this state, the display-image changing section 32, after the plurality of image data recorded in the data recording medium 7 is stored in the image-data storage section 31, displays on the display 13 an image folder name in which the plurality of data is stored. At this time, when identification information such as date and time of creating the image data and a person who has created the image data is disclosed in the image folder, that information may also be displayed on the display 13 in order to make it easy for the user to identify the type of the image folder.

When the data recording medium 7 has a plurality of image folders, each of the image folders including a plurality of image data, the user is made to select as to which image in the image folders is to be displayed on the display 13. Therefore, a list of the names of the plurality of images and a message which urges selection to the user may be displayed. Moreover, when an image folder is selected by the user by operating the operation button 12, the name of that image folder is displayed on the display 13 when the operation tab 17 is in the standby position.

When the operation tab 17 is turned to right by the user, a curvature of both the first element arranging portion 24 and the second element arranging portion 25 becomes large (a radius of curvature becomes small). Consequently, as shown in process item B in FIG. 5, the piezoelectric layer 27 of both the first piezoelectric element 21 and the second piezoelectric element 22 is compressed in a respective planar direction, and a negative voltage (−) is generated in the first piezoelectric element 21 and the second piezoelectric element 22 (between the detecting electrode 28, and the first element arranging portion 24 and the second element arranging portion 25). Accordingly, the display-image changing section 32 identifies that the operation tab 17 has been turned to right.

Here, when the operation tab 17 is turned from the standby position of being placed on the attachment surface 6a, to right with the rotation axis C as a center, the display-image changing section 32, from among the plurality of image data stored in the image-data storage section 31, displays an image of the first image data on the display 13. In this manner, only by turning of the operation tab 17 which is in the standby position by the user, the first image data is displayed on the display 13. Therefore, even for a user who is not good at the operation of the equipment, it is easy to start the image display in the printer 1. Moreover, when the operation tab 17 is turned to right as a page of a book is turned over, by the user, with an image being displayed on the display 13, the display-image changing section 32 changes the image data to be displayed as an image on the display 13, to the subsequent data.

On the other hand, when the operation tab 17 is turned to left as a page of a book is turned over, by the user, the curvature of both, the first element arranging portion 24 and the second element arranging portion 25 becomes small (the radius of curvature becomes large). Consequently, as shown in process item C in FIG. 5, the piezoelectric layer 27 of both the first piezoelectric element 21 and the second piezoelectric element 22 is extended in the planar direction, and a positive voltage (+) is generated in the piezoelectric layers 27. The detecting electrode 28, and the first element arranging portion 24 and the second element arranging portion 25 as the reference electrode, detect the generation of the positive voltage in the piezoelectric layers 27. According to the voltage detected by the detecting electrode 28 and the first element arranging portion 24 and the second element arranging portion 25, the display-image changing section 32 identifies that the operation tab 17 has been turned to left, and the image data to be displayed on the display 13 is changed to the previous data. In other words, the display-image changing section 32, according to a polarity of the voltage generated in the first piezoelectric layer 21 and the second piezoelectric layer 22, detects whether the direction of turning of the operation tab 17 around the rotation axis C is the right direction or the left direction.

In this manner, the user is able to change the image (go to the subsequent image or the previous image) to be displayed on the display 13 by turning to left and right the operation tab 17 in the form of a plate as turning over a page of a book.

Incidentally, in a case of forwarding in order an image (or returning an image) to be displayed on the display 13 by rotating the operation tab 17, after an image is displayed by rotating the operation tab 17 in one direction, for changing to the subsequent image by turning the operation tab 17 again in one direction, it is necessary to return the operation tab 17 once in the other direction. Therefore, for forwarding (or returning) the image data in order, it is necessary for the display-image changing section 32 to identify that an operation of returning the operation tab 17 once in the reverse direction is only for carrying out the next turning operation, and to identify this operation as an operation not intended for changing the image data.

Here, normally, since the operation of turning over a page of a book is carried out while looking contents or a picture etc. on the page, a speed of turning over the pages of a book is comparatively slower in many cases. Therefore, in the first embodiment, when it has detected that a value of the voltage output (absolute value) from the first piezoelectric element 21 and the second piezoelectric element 22 is smaller than a predetermined value, and that the operation tab 17 has been turned to right or to left at lower speed, the display-image changing section 32 makes a judgment that forwarding or returning of the image is sought by the user, and changes the image data which is to be displayed as an image on the display 13. Accordingly, it is possible to change the image to be displayed on the display 13 in the same manner as of turning over a page of a book.

Moreover, normally an operation of returning a hand for turning over the subsequent page after the page has been turned over is faster than the operation of turning over a page. Therefore, a rotation speed of returning the operation tab 17 when the operation tab 17 is returned to one direction after the operation tab 17 is turned, in order to change the display image, to the other direction is considered to become higher than a speed of turning at the time of changing the display image. Therefore, when it has been detected that the value of the voltage output (absolute value) from the first piezoelectric element 21 and the second piezoelectric element 22 is not less than the predetermined value, and that the operation tab 17 has been turned with a speed comparatively faster, which is not less than a predetermined speed, the display-image changing section 32 makes a judgment that the operation tab 17 has been returned only to change the image, and not that the forwarding or returning of the image to be displayed has been sought by the user, and does not change the image data to be displayed as an image. In this manner, the display-image changing section 32 detects whether the speed of turning the operation tab 17 is less than the predetermined value or not less than the predetermined value by identifying whether the voltage output from the first piezoelectric element 21 and the second piezoelectric element 22 is less than the predetermined value or not less than the predetermined value.

When the display-image changing process described above is put in order, it is as shown in FIG. 5. Firstly, when the operation tab 17 is at the standby position, an image folder name is displayed on the display 13 (process item A). When the operation tab 17 is turned from the standby position, an image of the first image data from among the plurality of image data is displayed on the display 13. Thereafter, when the operation tab 17 is turned to right at a slow speed (speed of turning: low) which is lower than the predetermined speed, the image to be displayed on the display 13 is changed to an image of the subsequent data (process item B). Moreover, when the operation tab 17 is turned to left at a slow speed (speed of turning: low) which is lower than the predetermined speed, the image to be displayed on the display 13 is changed to an image of the previous data (process item C). However, during the image changing operation, when the operation tab 17 is turned to right or left at a speed not lower than the predetermined speed, this operation is judged to be an operation of returning the operation tab 17 once, and the display image on the display 13 is not changed (process items D and E).

As it is clear from the abovementioned process, by turning the operation tab 17 to left and right alternately, at a slow speed which is lower (slower) than the predetermined speed, it is possible to display alternately an image of the previous image data and an image of the subsequent image data.

Moreover, as shown in FIG. 1, the display 13 is on the substantially same plane as of the operation tab 17 placed (mounted) on the attachment surface 6a (standby state). Therefore, the user is capable of changing the display image by operating the operation tab 17 while looking at the display 13, and it becomes easy to find a desired image.

Furthermore, as shown in FIG. 1, the display 13 is arranged on a side opposite to (left side of) the rotation axis C, with respect to the operation tab 17 in the standby position. In other words, with respect to the operation tab 17, the display 13 is positioned in a direction opposite to the direction in which the operation tab 17 is turned from the standby position. Namely, when the operation tab 17 in the standby position is turned to right, the display 13 on which the image is displayed is on a left side of the operation tab 17 which has been turned to right. Therefore, looking at the display 13 while turning the operation tab 17 to the opposite side of the display 13 is somewhat similar to looking at the subsequent page which is on the opposite side of the page which has been turned over, when a page of a book is turned over. Consequently, the operation at the time of changing the image becomes further closer to turning over the pages of a book.

Moreover, it is preferable that a surface of the operation tab 17, facing the attachment surface 6a when at the standby position is white, and that a color of the attachment surface 6a of the printer main body 6 is other than white. In this structure, when the operation tab 17 is turned to right as turning over a page of a book, a white facing surface (rear surface) of the operation tab 17 appears on the front side, and since the color of the attachment surface 6a is other than white, the white surface of the rear surface of the operation tab 17 is conspicuous. Therefore, when the operation of turning the operation tab 17 is carried out, it gives the user a feeling of a white-colored paper page appearing in front when a page of a book is turned over.

It is preferable that the color of the attachment surface 6a is a color having a low brightness such as black or navy blue which is more conspicuous than the white color of the rear surface of the operation tab 17. Furthermore, only the bottom surface of the recess 15 out of the attachment surface 6a may be let to be white colored, and the remaining portion may be let to be a color other than white. In this case, the white color of the rear surface of the operation tab 17 and the bottom surface of the recess 15 which appears when the operation tab 17 is turned, gives even stronger feeling of a white colored page appearing when a page of a book is turned over.

Next, an image selecting process by the image selecting section 33 will be described below by referring to process diagrams in FIG. 3 and FIG. 6. When the operation tab 17 is pulled by the user 17 to be separated away from the attachment surface 6a along the rotation axis C, the first piezoelectric element 21 and the second piezoelectric element 22 output a signal for selecting image data which is being displayed on the display 13, to the image selecting section 33.

As shown by an arrow b in FIG. 3, when the operation tab 17 is pulled by the user in a downward direction (frontward side), to be separated away from the attachment surface 6a, the image selecting section 33 selects the image data which is being displayed on the display 13 currently, and makes the recording head 2 to print that image on the printing paper P. Moreover, after the image selection (image recording) has been carried out in such manner, when the operation tab 17 is pulled by the user in an upward direction (rearward side), to be separated away from the attachment surface 6a, the image selecting section 33 cancels the selection of the image data which is being displayed currently on the display 13, and cancels the image recording.

With the operation tab 17 in a state of being turned through a certain angle from the standby position, when the operation tab 17 is pulled by the user in the downward-inclined direction (frontward side), to be separated away from the attachment surface 6a toward one side (lower end) of the rotation axis C, the curvature of the first element arranging portion 24 becomes small (the radius of curvature becomes large), whereas, the curvature of the second element arranging portion 25 becomes large (the radius of curvature becomes small). When the curvature of the first element arranging portion 24 and the second element arranging portion 25 changes, the piezoelectric layer 27 of the first piezoelectric element 21 is extended in the planar direction and a positive voltage (+) is generated, and at the same time, the piezoelectric layer 27 of the second piezoelectric element 22 is compressed in the planar direction and a negative voltage (−) is generated. Accordingly, the image selecting section 33 identifies that the operation tab 17 has been pulled in a downward-inclined direction, and outputs a signal to the recording control section 30, and makes the recording head 2 record on the printing paper P, the image data displayed as an image on the display 13.

Moreover, after an instruction to start recording of the display image is given as described above, when the operation tab 17 is pulled by the user in the upward-inclined direction (rearward side) to be separated away from the attachment surface 6a, the curvature of the first element arranging portion 24 becomes large (the radius of curvature becomes small), whereas the curvature of the second element arranging portion 25 becomes small (the radius of curvature becomes large). As the curvatures of the first element arranging portion 24 and the second element arranging portion 25 changes, the piezoelectric layer 27 of the first piezoelectric element 21 is compressed in the planar direction and a negative voltage (−) is generated, and at the same time, the piezoelectric layer 27 of the second piezoelectric element 22 is extended in the planar direction and a positive voltage (+) is generated. Accordingly, the image selecting section 33 identifies that the operation tab 17 has been pulled in the upward-inclined direction, and the image recording which has been carried out earlier is canceled.

In other words, when the operation tab 17 is pulled in a direction different from a direction orthogonal to a direction of the rotation axis (in the downward-inclined direction or the upward-inclined direction), unlike when turned around the rotation axis C as a center, a substantial difference is developed in the voltage generated in the first piezoelectric element 21 and the second piezoelectric element 22. Here, the image selecting section 33 detects a direction of movement (a component of movement in a direction different from the direction orthogonal to the direction of rotation axis) in a plane including the rotation axis C of the operation tab 17, when the difference in the voltage between the first piezoelectric element 21 and the second piezoelectric element 22 detected by the detecting electrode 28, and the first element arranging portion 24 and the second element arranging portion 25, becomes a certain fixed value or more, moreover, in the abovementioned example, the polarity of voltage of the first piezoelectric element 21 and the second piezoelectric element 22 has been opposite. However, according to the manner of pulling by the user, a case in which the polarity of the voltage of the first piezoelectric element 21 and the second piezoelectric element 22 is the same, and a magnitude of the value of the voltage is also possible. Even in such a case, the image selecting section 33 is capable of detecting the component of movement in the direction different from the direction orthogonal to the direction of rotation axis of the operation tab 17, based on the difference in the voltage of the first piezoelectric element 21 and the second piezoelectric element 22.

As it has been described above, the user is capable of selecting the image data which is displayed as an image on the display 13 and recording that image on the printing paper P by pulling the operation tab 17 towards the frontward side in the same manner as of ripping by pulling a predetermined page after selecting by turning over the pages of a book. Moreover, when the operation tab 17 is pulled frontward, the image data which is being displayed currently on the display 13 is selected, and the printing paper P on which the selected image is recorded by the recording head 2 is discharged along the direction of pulling (frontward direction) of the operation tab 17 by the transporting mechanism 3. In other words, when the image which is being displayed is to be recorded, the operation tab 17 may be pulled in the frontward direction in which the recording paper P is discharged. Therefore, even for a user who is not good at the operation of the equipment, it is easy to remember the operation at the time of recording the image.

Furthermore, by pulling the operation tab 17 in a direction on the opposite side (rearward direction) in the manner similar as of returning the page which has been selected by pulling frontward, it is possible to cancel the image selection (image recording) carried out earlier.

In the first embodiment which has been described above, the operation tab 17 is rotatably attached to the attachment surface 6a of the printer main body 6 via the connecting portion 18, and two piezoelectric elements namely the first piezoelectric element 21 and the second piezoelectric element 22 are provided to (on) the connecting portion 18 (the first element arranging portion 24 and the second element arranging portion 25). When various operations of the operation tab 17 are carried out by the user, a deformation peculiar to each operation occurs in the connecting portion 18. Moreover, a voltage signal is output from each of the first piezoelectric element 21 and the second piezoelectric element 22 according to the deformation of the connected portion 18 which is caused due to a displacement of the operation tab 17 by an operation of the user.

In other words, when the operation tab 17 is turned, the first piezoelectric element 21 and the second piezoelectric element 22 output a signal for changing the image data to be displayed as the image on the display 13, to the display-image changing section 32. Moreover, when the operation tab 17 is pulled to be separated away from the attachment surface 6a, the first piezoelectric element 21 and the second piezoelectric element 22 output a signal for selecting the image data which is being displayed on the display 13, to the image selecting section 33. Consequently, the user, only by operating the operation tab 17 is capable of changing the image to be displayed on the display 17, and carrying out various processes such as the selection of image, for the image data which has been displayed as the image on the display 13.

Moreover, a thickness of the first element arranging portion 24 and the second element arranging portion 25 is smaller than a thickness of the operation tab 17. Furthermore, the first element arranging portion 24 and the second element arranging portion 25 on which, the first piezoelectric element 21 and the second piezoelectric element 22 are arranged respectively are separated (isolated) by a gap in the direction of rotation axis C. Consequently, an amount of deformation of each of the first element arranging portion 24 and the second element arranging portion 25 when the operation tab 17 is operated becomes substantial. Therefore, it is possible to carry out the detection of operation of the operation tab 17 even more accurately based on the voltage signal which is output from the first piezoelectric element 21 and the second piezoelectric element 22, and misdetection is prevented.

Furthermore, since the first element arranging portion 24 and the second element arranging portion 25 which form the connecting portion 18 are formed by a metallic material, a fatigue strength with respect to repeated bending of the connecting portion 18 increases, and a durability is improved. Moreover, the connecting portion 18 being electroconductive, it is possible to use the connecting portion 18 as a reference electrode of the first piezoelectric element 21 and the second piezoelectric element 22.

Next, modified embodiments in which various modifications are made in the first embodiment will be described below. However, the same reference numerals are used for components having a structure similar as in the first embodiment, and the description of such components is omitted.

In the first embodiment, when the value of the voltage output from the first piezoelectric element 21 and the second piezoelectric element 22 is less than the predetermined value (when the speed of turning the operation tab 17 is lower than the predetermined speed), the display-image changing section 32 changes the image to be displayed on the display 13, and when the value of the voltage output from the first piezoelectric element 21 and the second piezoelectric element 22 is not less than the predetermined value (when the speed of turning the operation tab is not lower than the predetermined speed), the display-image changing section 32 makes a judgment that it is an operation of returning the operation tab 17, and the image is not changed (refer to FIG. 6). However, an arrangement may be made such that, when it is detected that the operation tab 17 is turned at a higher speed in the opposite direction to return to the original position, successively after the operation tab 17 has been turned at a lower speed in one direction in the manner such as of turning over a page, the display-image changing section 32 carries out the image change. In other words, an arrangement may be made such that, letting the movement of turning the operation tab 17 slowly in one direction and the operation of turning successively the operation tab 17 faster in the other direction to be one set, the display-image changing section 32 identifies that the image change has been instructed by the user.

The display-image changing process according to this modified embodiment is shown in FIG. 7. In FIG. 7, a point of displaying the image folder name on the display 13 when the operation tab 17 is at the standby position is same as in the first embodiment (process item A).

On the other hand, when the operation tab 17 is turned to left at a speed higher than a predetermined speed (speed of turning: high) after the operation tab 17 is turned to right at a speed lower than the predetermined speed (speed of turning: low), the display-image changing section 32 makes a judgment that the forwarding of the display image has been sought by the user, and changes the image to be displayed on the display 13 to the subsequent image (process item B). Moreover, when the operation tab 17 is turned to right at a speed not lower than the predetermined speed (speed of turning: high) after the operation tab 17 is turned to left at a speed lower than the predetermined speed (speed of turning: low), the display-image changing section 32 makes a judgment that the returning of the display image has been sought by the user, and changes the image to be displayed on the display 13 to the previous image (process item C).

As a process to be carried out on the image data selected by the image selecting section 33 when the operation tab 17 is pulled from the attachment surface 6a is not restricted to recording or canceling the recording of the image described in the first embodiment. For instance, when it is detected that the operation tab 17 has been pulled in the downward-inclined direction, the image selecting section 33 may increase (or decrease) the number of recordings of the image which is being displayed on the display 13, and conversely, when it is detected that the operation tab 17 has been pulled in the upward-inclined direction, the image selecting section 33 may decrease (or increase) the number of recording papers.

Figure 8A:
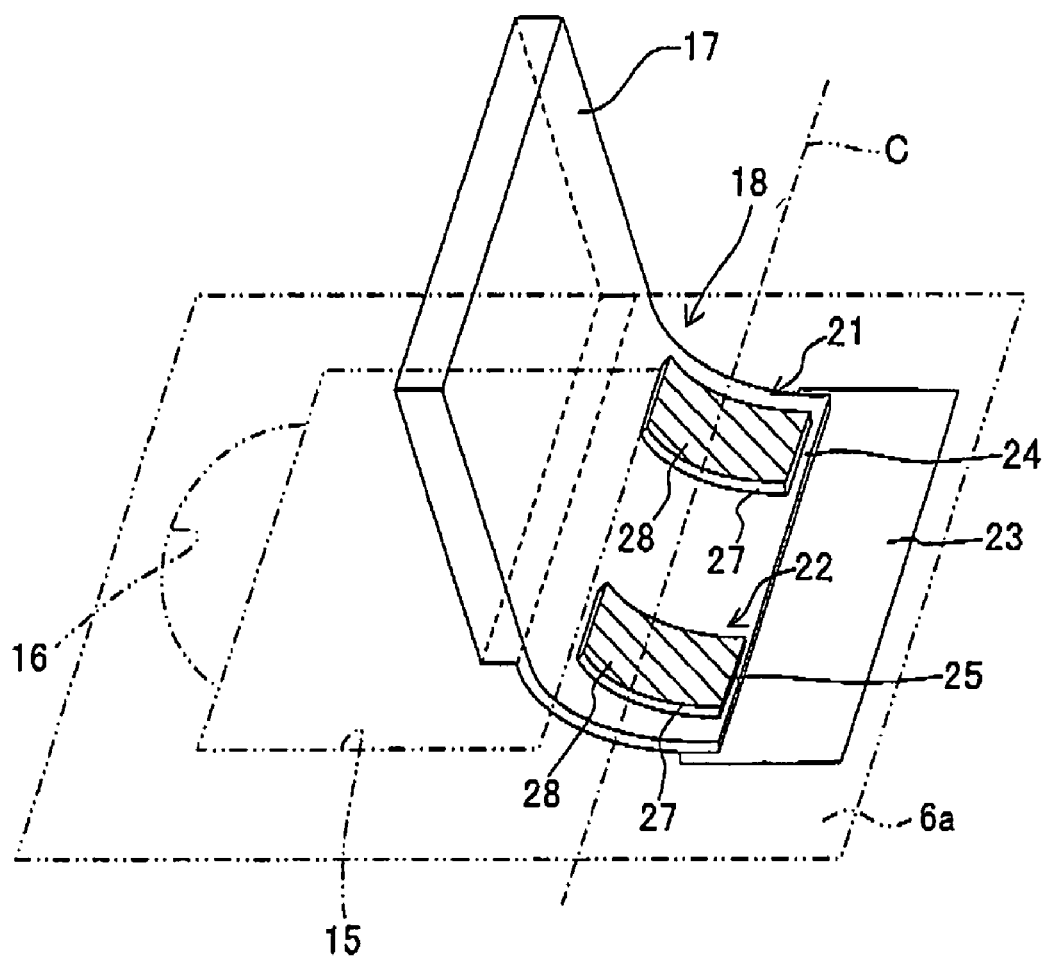
FIG. 8A and FIG. 8B are perspective views of a rotating member according to another modified embodiment.
Figure 8B:
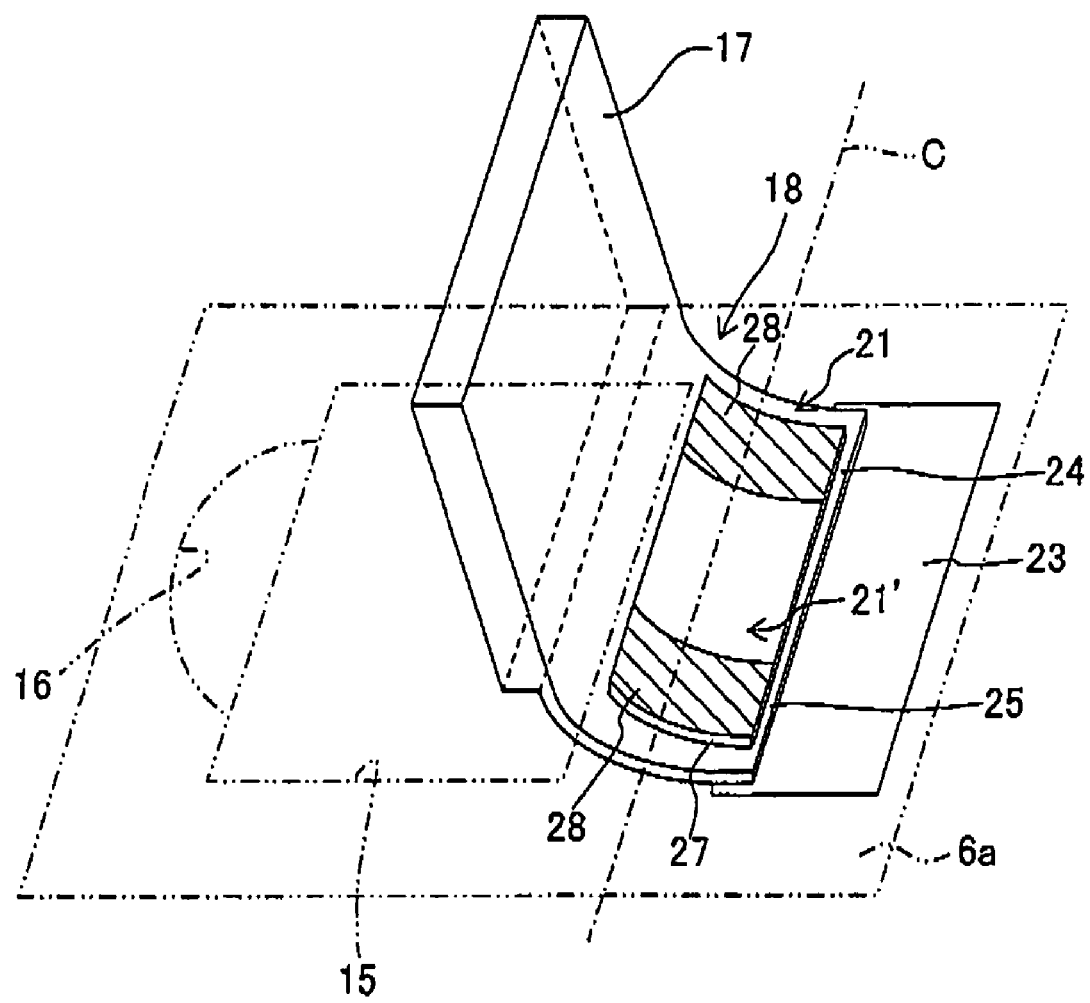

As shown in FIG. 8A, the notch 26 may not be formed between the first element arranging portion 24 and the second element arranging portion 25 of the connecting portion 18, on which the first piezoelectric element 21 and the second piezoelectric element 22 are arranged respectively (refer to FIG. 3), and the first element arranging portion 24 and the second element arranging portion 25 may have been connected with respect to the direction of the rotation axis C. In this case, as compared to a case in which the first element arranging portion 24 and the second element arranging portion 25 are separated by leaving a gap therebetween, the deformation developed in each of the first element arranging portion 24 and the second element arranging portion 25 when the operation tab 17 has been operated becomes small. However, due to the increase in the strength of the connecting portion 18, the durability improves. Moreover, as shown in FIG. 8B, one piezoelectric element 21' may be formed on the connecting portion 18, to extend in the direction of the rotation axis C, and two detecting electrodes 28 may be formed to be separated toward two end portions (a frontward side and a rearward side in FIG. 8B) in the direction of the rotation axis C of the piezoelectric element 21'.

Figure 9:
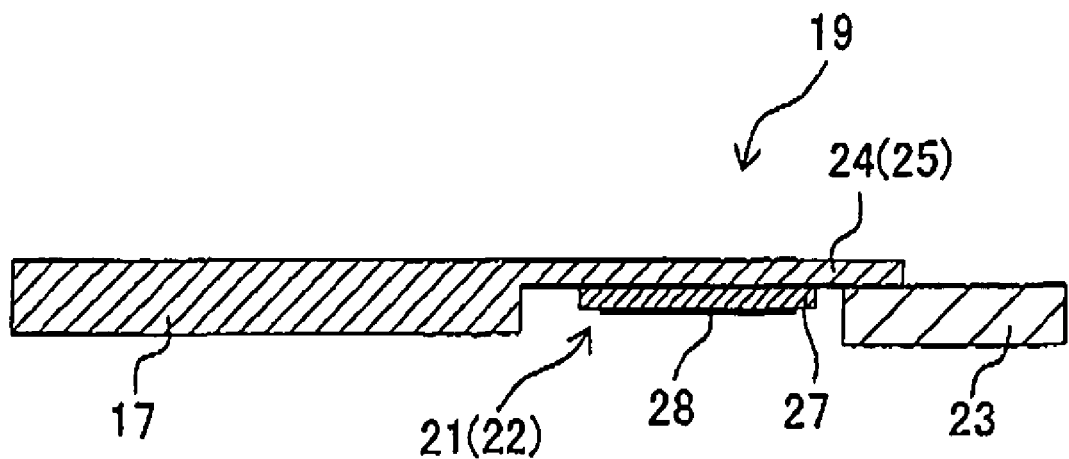
FIG. 9 is a cross-sectional view of a rotating member according to still another modified embodiment.

As shown in FIG. 9, the first piezoelectric element 21 and the second piezoelectric element 22 may have been arranged on a rear surface of the first element arranging portion 24 and the second element arranging portion 25 of the connection portion 18. In this case, when the user operates the operation tab 17, since a member etc. which exists around the operation tab 17 or the hand of the user hardly makes a contact with the first piezoelectric element 21 and the second piezoelectric element 22, the first piezoelectric element 21 and the second piezoelectric element 22 are hardly damaged.

The number of piezoelectric elements to be arranged on the connecting portion 18 is not restricted to two, and three or more piezoelectric elements may have been arranged to be separated mutually in the direction of the rotation axis C.

The rotating member 19 which is made of an operation tab and the connecting portion is not particularly required to be formed of an electroconductive material. However, when the connecting portion 18 is formed of an insulating material, a reference electrode made of an electroconductive material is provided between the connecting portion 18 and the piezoelectric layer 27.

The operation tab 17 in the first embodiment is a knob which corresponds to a right-hand book which opens to right from the standby position. However, an arrangement may be made such that the operation tab 17 corresponds to a left-hand book which opens to left from the standby position.

Figure 10:
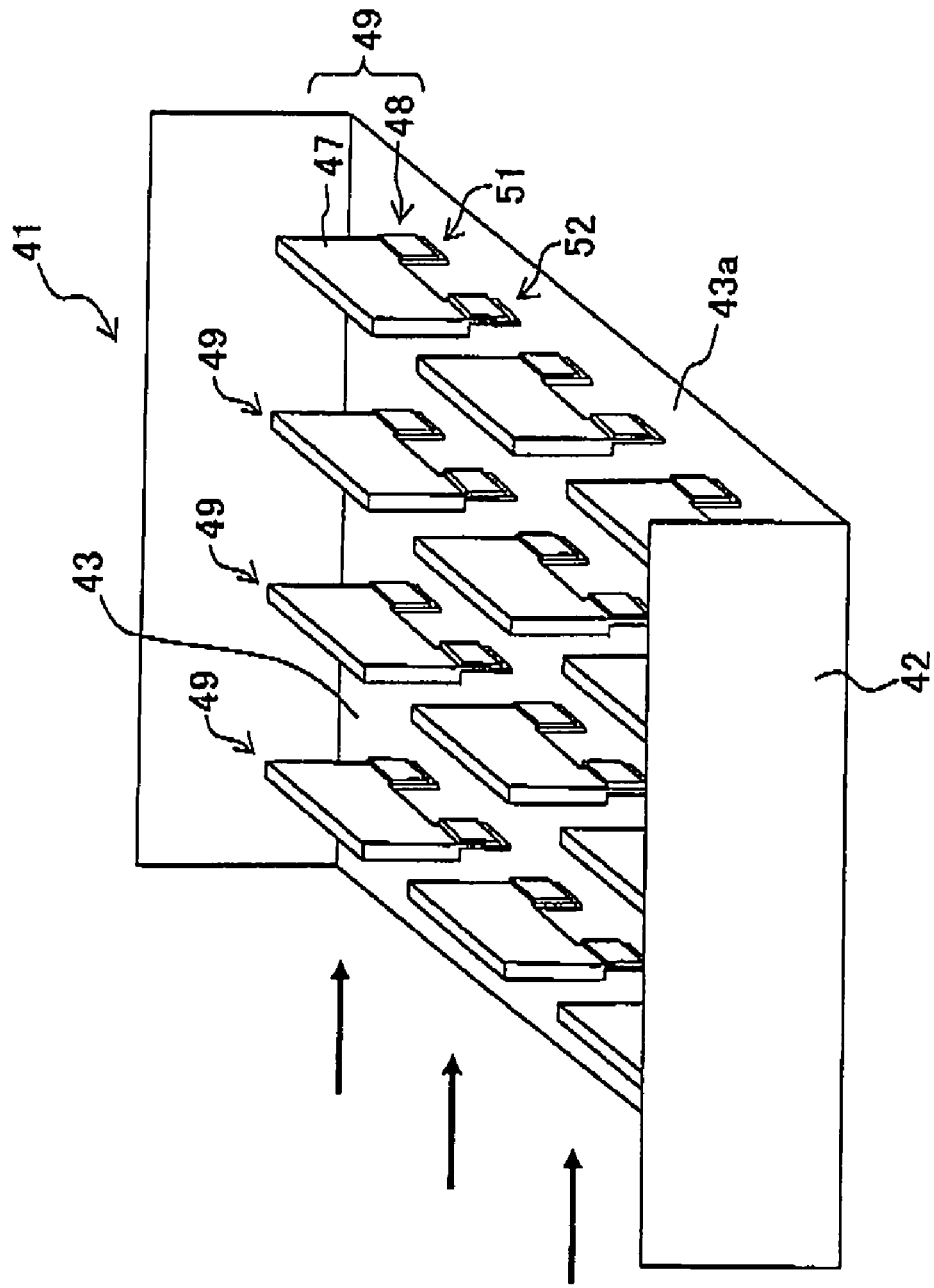
FIG. 10 is a partial perspective view of a fluid transporting apparatus according to a second embodiment of the present invention.

Next, a second embodiment of the present invention will be described below. The second embodiment is an example in which the present invention is applied to a structure of detecting a behavior (flow condition) of a fluid which flows through a channel of a fluid transporting apparatus. FIG. 10 is a partial perspective view of a fluid transporting apparatus according to the second embodiment, FIG. 11 is a partially enlarged view of FIG. 10, and FIG. 12 is a block diagram showing schematically an electrical structure of the fluid transporting apparatus.

As shown in FIG. 10, a fluid transporting apparatus 41 has a channel forming member 42 (base member) at an interior of which a channel 43 is formed. The structure is such that the channel 43 extends in left-right direction in FIG. 10, and the fluid transporting apparatus 41 applies a pressure to a fluid (a liquid or a gas) by a pressure feeding mechanism such as a pump or a compressor, and the fluid is transported through the channel 43, from left to right in FIG. 10.

Figure 11:
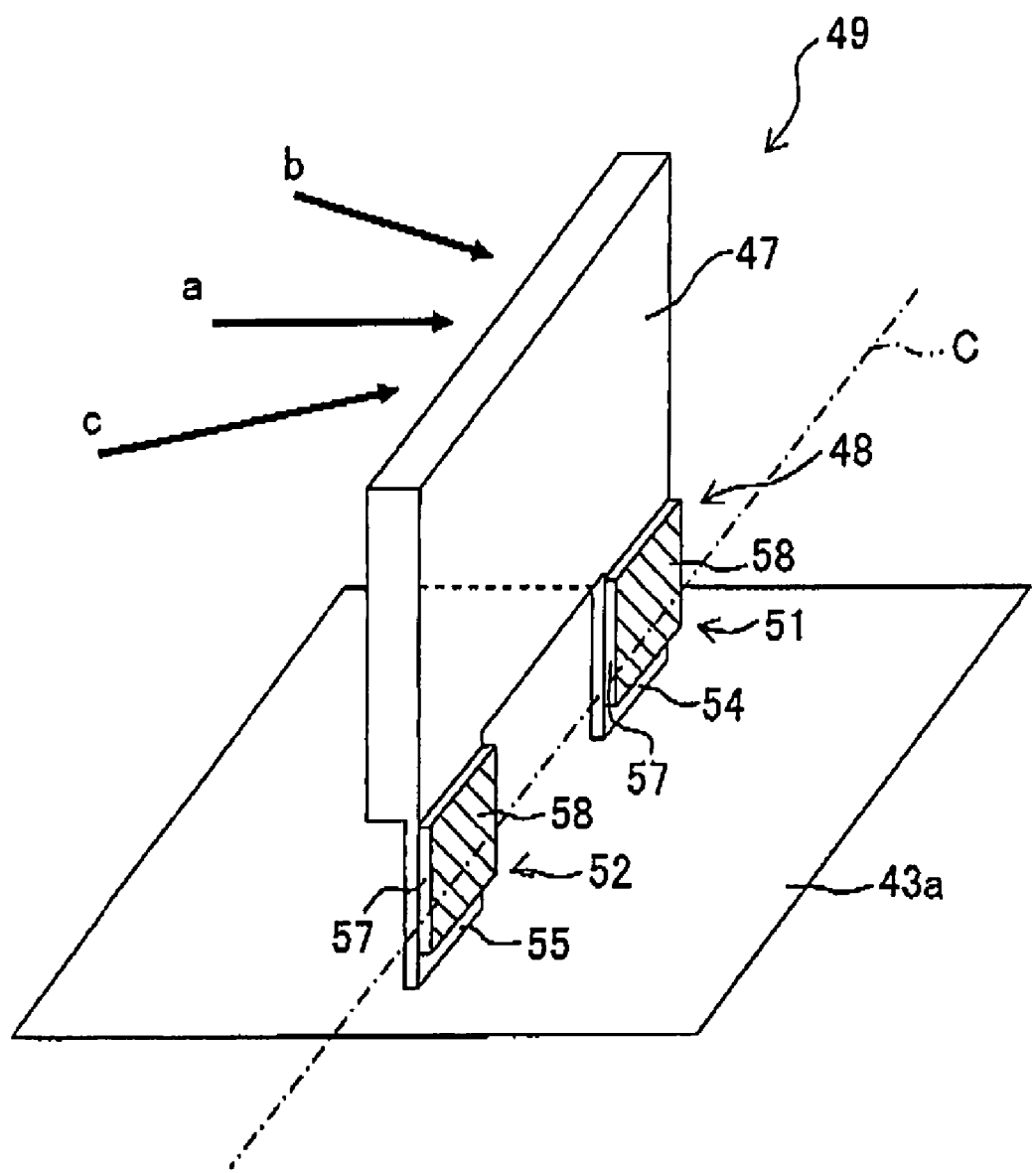
FIG. 11 is a partially enlarged view of FIG. 10.
Figure 12:
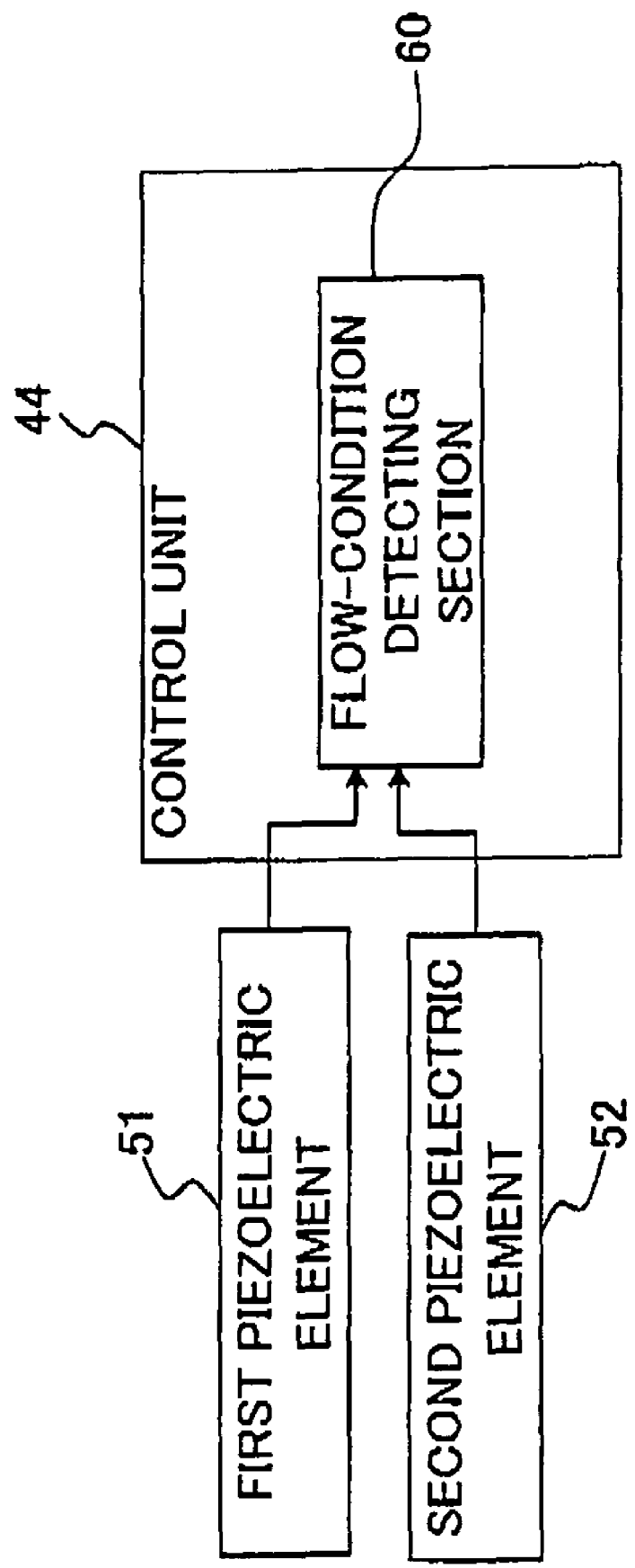
FIG. 12 is a block diagram schematically showing an electrical arrangement of the fluid transporting apparatus.

As shown in FIG. 10 and FIG. 11, a plurality of rotating members 49 which have a detection plate 47 (body portion) having a rectangular shape which is contactable with the fluid flowing through the channel 43, and a connecting portion 48 which rotatably connects the detection plate 47 to a bottom surface 43a of the channel 43 around an rotation axis C as a center. As shown in FIG. 10, the rotating members 49 are arranged in rows in two directions namely a longitudinal direction of the channel 43 (direction of flow of the fluid: left-right direction in FIG. 10) and a width direction of the channel 43 (frontward and rearward direction in FIG. 10).

The detection plate 47 of each rotating member 49 extends in the width direction of the channel 43, such that the detection plate 47 is orthogonal to the direction of flow of the fluid (left-right direction). Moreover, the connecting portion 48 extends downward from a lower end portion of the detection plate 47, and includes two element arranging portions (a first element arranging portion 54 and a second element arranging portion 55) arranged in the width direction of the channel. A lower end of each of the first element arranging portion 54 and the second element arranging portion 55 is fixed to the bottom surface 43a of the channel 43. Accordingly, the detection plate 47 is rotatable left-right around a virtual rotation axis C as a center extending in the width direction of the channel. Furthermore, the detection plate 47 and the connecting portion 48 (the first element arranging portion 54 and the second element arranging portion 55) are formed integrally of a metallic material such as stainless steel. Moreover, a thickness of the first element arranging portion 54 and the second element arranging portion 55 is smaller than a thickness of the detection plate 47.

Two piezoelectric elements (a first piezoelectric element 51 and a second piezoelectric element 52) are formed respectively on the first element arranging portion 54 and the second element arranging portion 55 forming the connecting portion 48. Each of the first piezoelectric element 51 and the second piezoelectric element 52 has a piezoelectric layer 57 which is arranged on a right surface (surface on a downstream side of the direction of flow) of the first element arranging portion 54 and the second element arranging portion 55 respectively, and a detecting electrode 58 which is formed on a surface of the piezoelectric layer 57. Even in the second embodiment, each of the first element arranging portion 54 and the second element arranging portion 55 may face the detecting electrode 58, sandwiching the piezoelectric layer 57, and a predetermined electric potential is always applied to the first element arranging portion 54 and the second element arranging portion 55.

As shown by an arrow a in FIG. 11, when the fluid flowing through the channel 43 is hit against a left surface of the detection plate 47, the first element arranging portion 54 and the second element arranging portion 55 of the connecting portion 48 are bent and deformed, and the detection plate 47 turns to right. At this time, the piezoelectric layer 57 of both the first piezoelectric element 51 and the second piezoelectric element 52 is compressed, and a negative voltage (−) is generated in the first piezoelectric element 51 and the second piezoelectric element 52 (between the detecting electrode 58, and the first element arranging portion 54 and the second element arranging portion 55). Moreover, a speed of deformation by bending of the connecting portion 48 changes according to a magnitude of a flow speed, and greater the magnitude of the flow speed, a value of the voltage (absolute value) generated in the first piezoelectric element 51 and the second piezoelectric element 52 becomes high.

Moreover, as shown by arrows b and c in FIG. 11, when a direction of collision of the fluid against the detection plate 47 is inclined locally in a left-right direction or when there is an unevenness in a local flow velocity in the fluid which hits against the detection plate 47, the detection plate 47 is twisted, and the first element arranging portion 54 and the second element arranging portion 55 are deformed in a different manner. As the first element arranging portion 54 and the second element arranging portion 55 are deformed, a distortion occurring in the piezoelectric layer 57 differs for the first piezoelectric element 51 and the second piezoelectric element 52, and there is a difference in a value of voltage which is generated between the first piezoelectric element 51 and the second piezoelectric element 52.

For instance, when a fluid velocity at a frontward side in FIG. 11 has increased, and a fluid velocity at a rearward side in FIG. 11 has decreased, a force acting on a frontward side portion of the detection plate 47 increases, and a force acting on a rearward side portion of the detection plate 47 decreases. At this time, a curvature of the first element arranging portion 54 positioned at the rearward side becomes small (a radius of curvature becomes large), whereas, a curvature of the second element arranging portion 55 positioned at the frontward side becomes large (a radius of curvature becomes small). Therefore, the piezoelectric layer 57 of the first piezoelectric element 51 positioned at the rearward side is extended, and a positive voltage is generated in the first piezoelectric element 51. On the other hand, the piezoelectric layer 57 of the second piezoelectric element 52 positioned at the frontward side is compressed, and a negative voltage is generated in the second piezoelectric element 52.

In such manner, a movement (such as turning and twisting) of the detection plate 47 depends on the collision of the fluid with the detection plate 47, and according to the deformation of the connecting portion 48 at that time, a voltage signal is output from the first piezoelectric element 51 and the second piezoelectric element 52 provided on the connecting portion 48 to a control unit 44 of the fluid transporting apparatus 41 (refer to FIG. 12).

The control unit 44 of the fluid transporting apparatus 41 includes a CPU, a ROM which stores data and computer programs related to the transporting of a fluid, a RAM which stores temporarily data to be processed by the CPU, and an input-output interface which inputs and outputs a signal between the fluid transporting apparatus 41 and an external apparatus. Moreover, the control unit 44 controls various movements of various structural elements forming the fluid transporting apparatus 41, such as a pressure feeding mechanism which applies a pressure to the fluid inside the channel 43.

Furthermore, the control unit 44 includes a flow-condition detector 60 (detecting mechanism) which detects a flow-condition of the fluid based on the output signal which is input to the control unit 44 from each of the first piezoelectric element 51 and the second piezoelectric element 52. The flow-condition detector 60 is realized by the CPU, the ROM, and the RAM etc., which form the control unit 44. Moreover, the flow-condition detector 60 identifies the movement such as the turning and the twisting of the detection plate 47 from the voltage signal which is output from the first piezoelectric element 51 and the voltage signal which is output from the second piezoelectric element 52, and further, detects a behavior (such as a local direction of flow and the flow velocity) of the fluid which hits against the detection plate 47, from the movement of the detection plate 47.

Particularly, in the second embodiment, the plurality of rotating members 49 are installed inside the channel 43, and it is possible to detect the local direction of flow and the flow velocity at a plurality of locations inside the channel 43. Consequently, the flow-condition detector 60 is capable of detecting the direction of flow and a distribution of the flow velocity inside the channel, based on the voltage signal from the first piezoelectric elements 51 and the second piezoelectric element 52 provided on the plurality of rotating members 49.

In the abovementioned description, the rotating member 49 having the detection plate 47 and the connecting portion 48 (the first element arranging portion 54 and the second element arranging portion 55), the two piezoelectric elements namely the first piezoelectric element 51 and the second piezoelectric element 52 provided on the connecting portion 48, and the flow-condition detector 60 of the control unit 44 correspond to a movement detector of the present invention.

According to the structure of the second embodiment described above, when fluid flowing through the channel 43 hits against the detection plate 47, the movement (turning or twisting) of the detection plate 47 depends on the manner of the collision, and a deformation peculiar to each movement occurs in the connecting portion 48. Moreover, according to the deformation of the connecting portion 48 which has occurred due to the flow condition, the signal is output from the first piezoelectric element 51 and the second piezoelectric element 52 provided on the connecting portion 48, and due to the voltage signal which is output, it is possible to detect the behavior (flow condition) of the fluid by the flow-condition detector 60.

Since the two piezoelectric elements namely, the first piezoelectric element 51 and the second piezoelectric element 52 being arranged on a right side (downstream side) surface of the two element arranging portions namely, the first element arranging portion 54 and the second element arranging portion 55 of the connecting element 48, the damage of the first piezoelectric element 51 and the second piezoelectric element 52 due to the collision (hitting) of the fluid is suppressed as much as possible.

Apart from this, even in the second embodiment, it is possible to make a modification similar as in the first embodiment described above. For instance, the first element arranging portion 54 and the second element arranging portion 55 of the connecting portion 48 may be connected in the frontward and rearward direction. Moreover, three or more piezoelectric elements may be arranged on the connecting portion 48 which connects the detection plate 47 to the bottom surface 43a of the channel 43.

Figure 13:
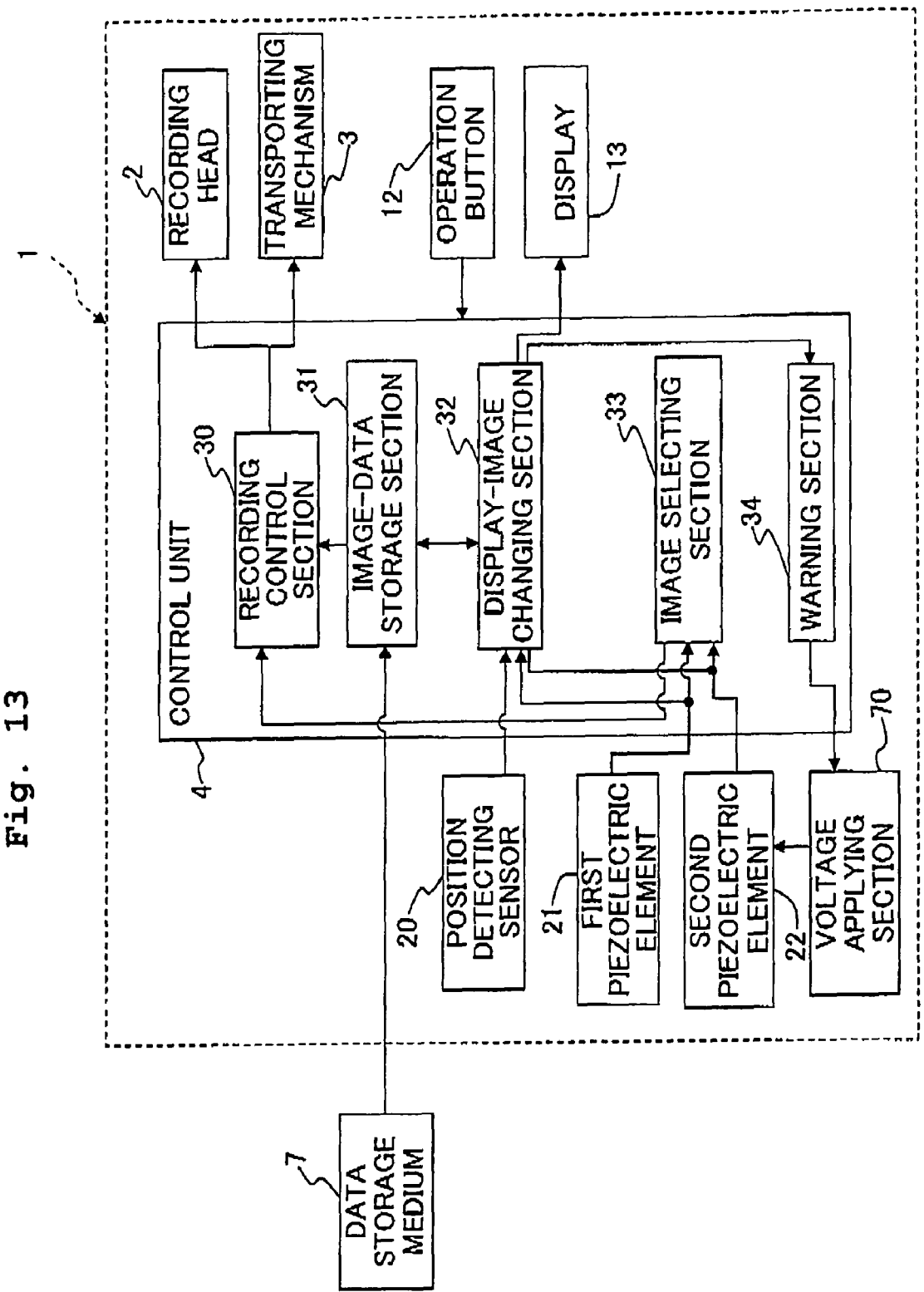
FIG. 13 is a block diagram schematically showing an electrical arrangement of a printer according to a third embodiment.

Next, a third embodiment of the present invention will be described below. The third embodiment is a structure which has been made to make it possible to give a warning to the user operating the printer in the first embodiment, by making vibrate the operation tab 17. FIG. 13 is a block diagram showing schematically an electrical structure of a printer in the third embodiment, and same reference numerals are assigned to components which have the same structure as in the first embodiment. Moreover, an appearance of the printer 1 is same as in the first embodiment shown in FIG. 1. In the following description, the description of the components same as in the first embodiment is omitted.

As shown in FIG. 13, the printer 1 of the third embodiment, has the control unit 4 which includes a warning section 34, in addition to the structure of the printer 1 in the first embodiment. Furthermore, the printer 1 includes a voltage applying section 70 which applies an alternating voltage (AC voltage) to the second piezoelectric element.

The warning section 34 gives a command to the voltage applying section 70 to apply a voltage to the second piezoelectric element 22 according to an image which the display-image changing section 32 has selected. Moreover, according to this command, the voltage applying section 70 applies to the second piezoelectric element 22, the alternating voltage of about 10 kH to make the operation tab 17 vibrate. Accordingly, it is possible to transmit information such as various warnings to the user who is operating, by making the user feel the vibration of the operation tab 17.

For instance, when the image selected by the display-image changing section 32 is the last page of the continuous images stored in the image-data storage section 31, in a case of warning the user that it is not possible to update the pages, an arrangement may be made such that, according to the selection of the last page of the continuous images by the display-image changing section 32, the warning section 34 applies the alternating voltage to the second piezoelectric element 22 by controlling the voltage applying section 70, and makes the operation tab 17 vibrate. In this manner, according to the third embodiment of the present invention, it is possible to realize the mechanism which makes vibrate the operation tab 17 for transmitting the information to the user, at a low cost without adding an exclusive vibration imparting mechanism, and make the apparatus easy-to-use. The voltage applying section 70 may apply an alternating voltage not only to the second piezoelectric element 22 but also to the first piezoelectric element 21.

In the embodiments described above, all the element arranging portions have been formed of a metallic material, and a predetermined electric potential has been applied to the element arranging portions. However, when the detecting electrode is formed on the piezoelectric layer, the element arranging portion is not necessarily required to be formed of an electroconductive material, and may not act as the reference electrode.

In the description made above, an example in which the movement detector of the present invention is applied to an operating section of a printer and a detection of behavior of a fluid which flows through a channel of the fluid transporting apparatus has been described. However, a field to which the present invention is applicable is not restricted to this, and the present invention is also applicable to an electronic equipment in which, it is necessary to detect a movement such as a rotating movement of an object to be detected which is rotatably connected to a base member, or a movement of coming closer to/going away from a base member, or a twisting movement.

What is claimed is:

1. A movement detector which is rotatably attached to a base member, comprising:
   a rotating member which has a body portion, and a connecting portion which rotatably connects the body portion to the base member;
   a piezoelectric layer which is formed on the connecting portion; and
   a plurality of electrodes which are provided on the piezoelectric layer and arranged in a direction of a rotation axis of the body portion, and which detect a voltage generated in the piezoelectric layer corresponding to a deformation of the connecting portion when the body portion is displaced with respect to the base member;
   wherein the detector detects a component of movement in a direction, which is different from a direction orthogonal to the direction of the rotation axis of the body portion, based on a difference in voltage signals detected by the electrodes.

2. The movement detector according to claim 1;
   wherein the piezoelectric layer is formed as a plurality of piezoelectric layers which are arranged in the direction of the rotation axis of the body portion, and each of the plurality of electrodes are formed on one of the piezoelectric layers.

3. The movement detector according to claim 2, further comprising:
   a detector which detects a movement of the body portion based on the voltage detected by the electrodes.

4. The movement detector according to claim 2, claim 2;
   wherein the connecting portion has a plurality of element installing portions on which the plurality of piezoelectric layers are formed respectively, and the element installing portions are arranged to be mutually separated in the direction of the rotation axis of the body portion.

5. The movement detector according to claim 4;
   wherein the element installing portion is formed of a metallic material, and a predetermined electric potential is always applied to the element installing portion.

6. The movement detector according to claim 1;
   wherein a thickness of the connecting portion is less than a thickness of the body portion.

7. The movement detector according to claim 1;
   wherein the connecting portion is formed of a metallic material.

8. The movement detector according claim 2;
   wherein the detector detects a direction of rotation of the body portion based on a polarity of a voltage signal detected by the electrodes.

9. The movement detector according to claim 2;
   wherein the detector detects a movement speed of the body portion based on a magnitude of a voltage signal detected by the electrodes.

10. The movement detector according to claim 2, further comprising:
    a voltage applying section which applies an alternating voltage to at least one of the plurality of electrodes to vibrate the body portion.

11. The movement detector according to claim 2;
    wherein the movement detector is provided on a printer having an image display section which displays images of image data, an image recording section which records, on a recording medium, an image of an image datum among the image data selected, and a controller which controls the image display section and the image recording section; and
    wherein the body portion is rotatably connected to an attachment surface provided on a printer body, via the connecting portion, and
    wherein the piezoelectric layers and the electrodes formed on the connecting portion output, to the controller, a signal for changing the image data to be displayed on the image display section, or output a signal for selecting the image data which is displayed on the image display section, according to a deformation of the connecting portion when the body portion is operated.

12. The movement detector according to claim 2;
    wherein the movement detector is provided on a channel forming member having a channel through which a fluid flows, and
    wherein the body portion is arranged inside the channel to make contact with the fluid, and is rotatably connected to a surface inside the channel via the connecting portion.

* * * * *